(12) United States Patent
Saegusa

(10) Patent No.: US 10,229,884 B2
(45) Date of Patent: Mar. 12, 2019

(54) SEMICONDUCTOR DEVICE

(71) Applicant: FUJI ELECTRIC CO., LTD., Kawasaki-shi, Kanagawa (JP)

(72) Inventor: Naoki Saegusa, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/666,545

(22) Filed: Aug. 1, 2017

(65) Prior Publication Data

US 2018/0096937 A1    Apr. 5, 2018

(30) Foreign Application Priority Data

Sep. 30, 2016    (JP) .................................. 2016-192672

(51) Int. Cl.
*H01L 21/48* (2006.01)
*H01L 23/00* (2006.01)
(Continued)

(52) U.S. Cl.
CPC ...... *H01L 23/5385* (2013.01); *H01L 21/4817* (2013.01); *H01L 23/04* (2013.01); *H01L 23/08* (2013.01); *H01L 23/3121* (2013.01); *H01L 23/34* (2013.01); *H01L 23/49861* (2013.01); *H01L 23/5386* (2013.01); *H01L 24/48* (2013.01); *H01L 25/0655* (2013.01); *H01L 23/367* (2013.01); *H01L 24/32* (2013.01); *H01L 24/73* (2013.01); *H01L 2224/32225* (2013.01);
(Continued)

(58) Field of Classification Search
CPC ..... H01L 23/5385; H01L 23/04; H01L 23/08; H01L 23/3121; H01L 23/34; H01L 23/49861; H01L 23/5386; H01L 23/367; H01L 24/48; H01L 24/32; H01L 24/73; H01L 21/4817; H01L 25/0655
See application file for complete search history.

(56) References Cited

U.S. PATENT DOCUMENTS 9,275,930 B2 *  3/2016  Mashimo .............. H01L 21/565
9,673,118 B2 *  6/2017  Taya ..................... H01L 23/053
(Continued)

FOREIGN PATENT DOCUMENTS

JP    2005-278339 A    10/2005
JP    2006-093255 A    4/2006
(Continued)

*Primary Examiner* — Mark W Tornow
(74) *Attorney, Agent, or Firm* — Rabin & Berdo, P.C.

(57) ABSTRACT

A semiconductor device includes a lead frame. One end portion of the lead frame is disposed outside a case, the other end portion of the lead frame is disposed over a front surface of an insulating board inside the case and near a semiconductor element, and the lead frame is formed in the case. Furthermore, the semiconductor device includes a temperature transducer disposed on a side of the other end portion of the lead frame opposite a laminated substrate and near a side portion of a semiconductor element. As a result, the temperature transducer is disposed near the side portion of the semiconductor element in the semiconductor device. Therefore, the temperature of the semiconductor element is properly detected. In addition, the length in the vertical direction of the case of the semiconductor device is reduced and miniaturization is realized.

8 Claims, 12 Drawing Sheets

(51) Int. Cl.
  *H01L 23/04*     (2006.01)
  *H01L 23/538*    (2006.01)
  *H01L 23/08*     (2006.01)
  *H01L 23/31*     (2006.01)
  *H01L 23/34*     (2006.01)
  *H01L 23/498*    (2006.01)
  *H01L 25/065*    (2006.01)
  *H01L 23/367*    (2006.01)

(52) U.S. Cl.
  CPC ........... *H01L 2224/48091* (2013.01); *H01L 2224/48175* (2013.01); *H01L 2224/48225* (2013.01); *H01L 2224/73265* (2013.01)

(56) References Cited

U.S. PATENT DOCUMENTS

| | | | |
|---|---|---|---|
| 2006/0060982 | A1 | 3/2006 | Ikawa et al. |
| 2011/0042812 | A1 | 2/2011 | Kayukawa et al. |
| 2011/0116236 | A1* | 5/2011 | Akahori ............... H05K 1/141 361/704 |
| 2012/0074552 | A1* | 3/2012 | Mashimo ............. H01L 21/565 257/676 |
| 2012/0175757 | A1 | 7/2012 | Katsuki |

FOREIGN PATENT DOCUMENTS

| | | |
|---|---|---|
| JP | 2011-044452 A | 3/2011 |
| JP | 2012-146815 A | 8/2012 |
| JP | 2014-007345 A | 1/2014 |

\* cited by examiner

SEMICONDUCTOR DEVICE

CROSS-REFERENCE TO RELATED APPLICATION

This application is based upon and claims the benefit of priority of the prior Japanese Patent Application No. 2016-192672, filed on Sep. 30, 2016, the entire contents of which are incorporated herein by reference.

BACKGROUND OF THE INVENTION

1. Field of the Invention

The embodiments discussed herein are related to a semiconductor device.

2. Background of the Related Art

A semiconductor device includes a power semiconductor element and a laminated substrate formed by laminating a circuit pattern and an insulating board. With the semiconductor device a temperature transducer, such as a thermistor, is disposed, together with the power semiconductor element, over the circuit pattern. The temperature transducer is electrically connected to an external connection terminal. The temperature transducer detects the temperature of the power semiconductor element and monitors the temperature of the power semiconductor element which generates heat as a result of the operation.

Japanese Laid-open Patent Publication No. 2006-093255

However, this semiconductor device needs an area of the circuit pattern for disposing the temperature transducer over the laminated substrate and an area of the external connection terminal for making a connection with the temperature transducer. This increases the manufacturing costs of the semiconductor device.

SUMMARY OF THE INVENTION

According to an aspect, there is provided a semiconductor device including a semiconductor element, a laminated substrate including an insulating board and a circuit board which is formed over a front surface of the insulating board and over which the semiconductor element is disposed, a case bonded to the laminated substrate so that the semiconductor element is disposed inside, an external connection terminal including one end portion disposed outside the case and another end portion disposed over the front surface of the insulating board inside the case, the external connection terminal being formed in the case, and a temperature transducer which is disposed over the other end portion of the external connection terminal and which includes a side opposite a side portion of the semiconductor element in a top view.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings.

First Embodiment

A semiconductor device will be described by the use of FIGS. 1 through 4.

Figure 1:
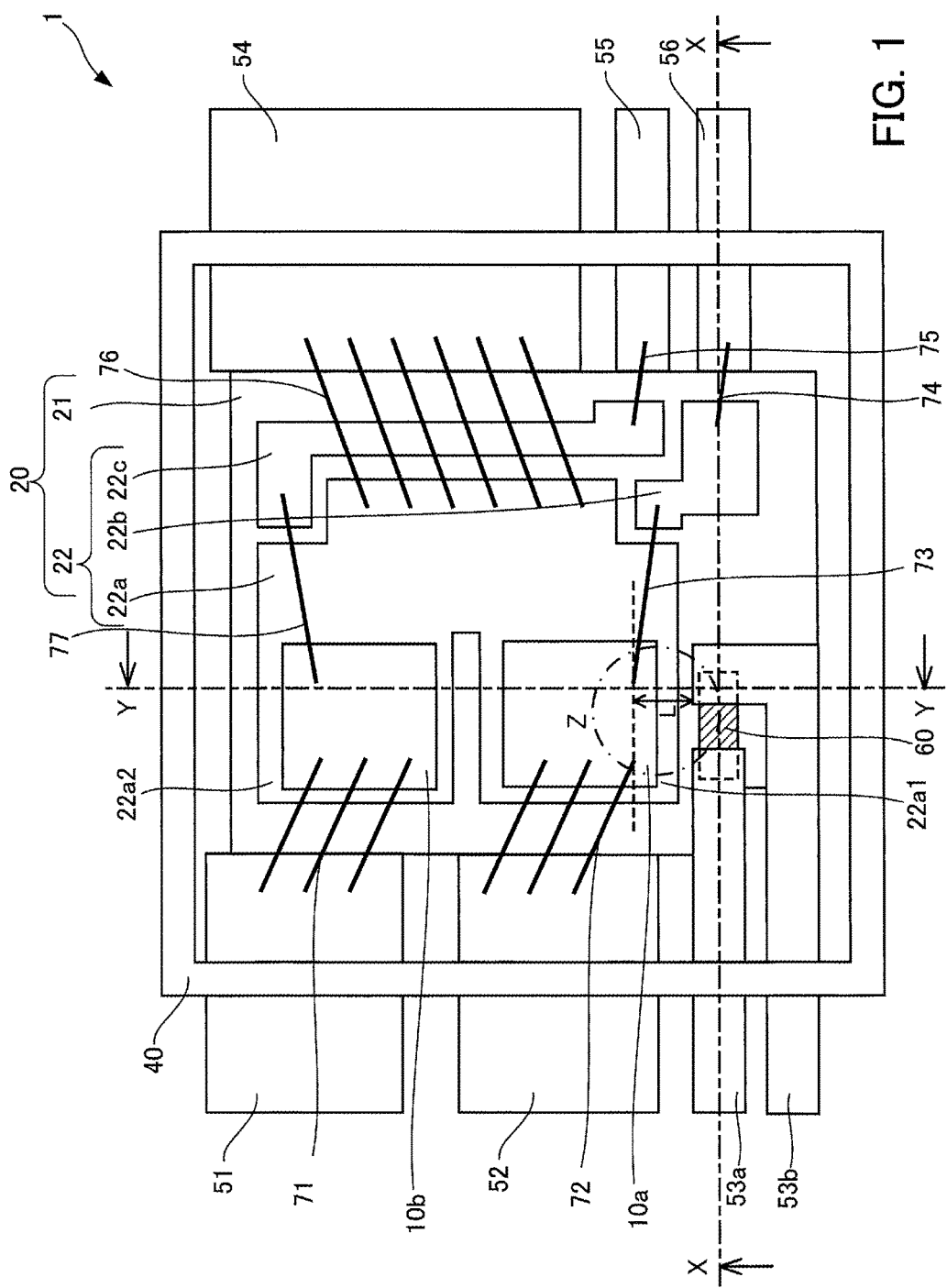
FIG. 1 is a top view of a semiconductor device according to a first embodiment.
Figure 2:
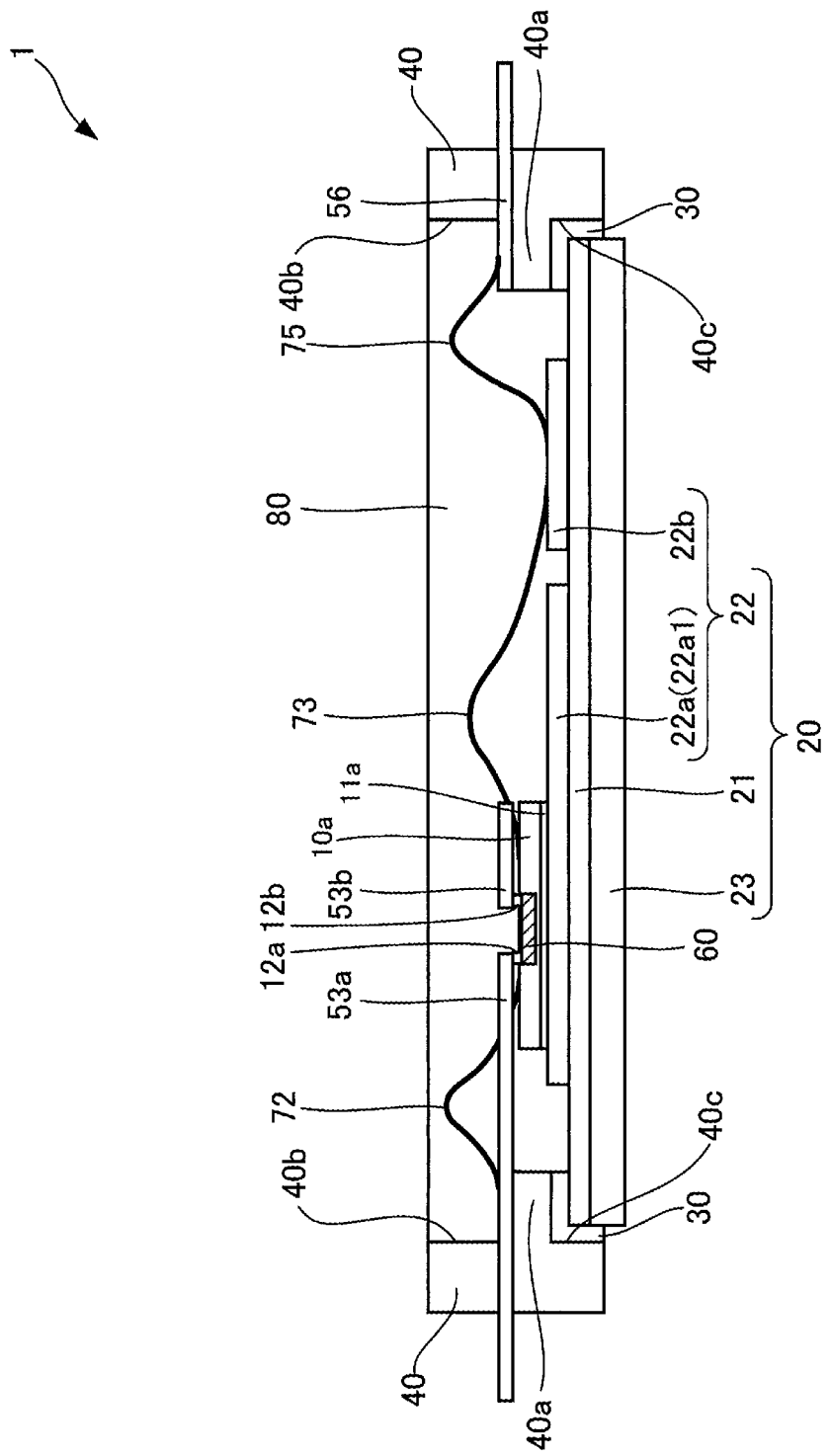
FIG. 2 is a cross-sectional view of the semiconductor device according to the first embodiment (part 1)
Figure 3:
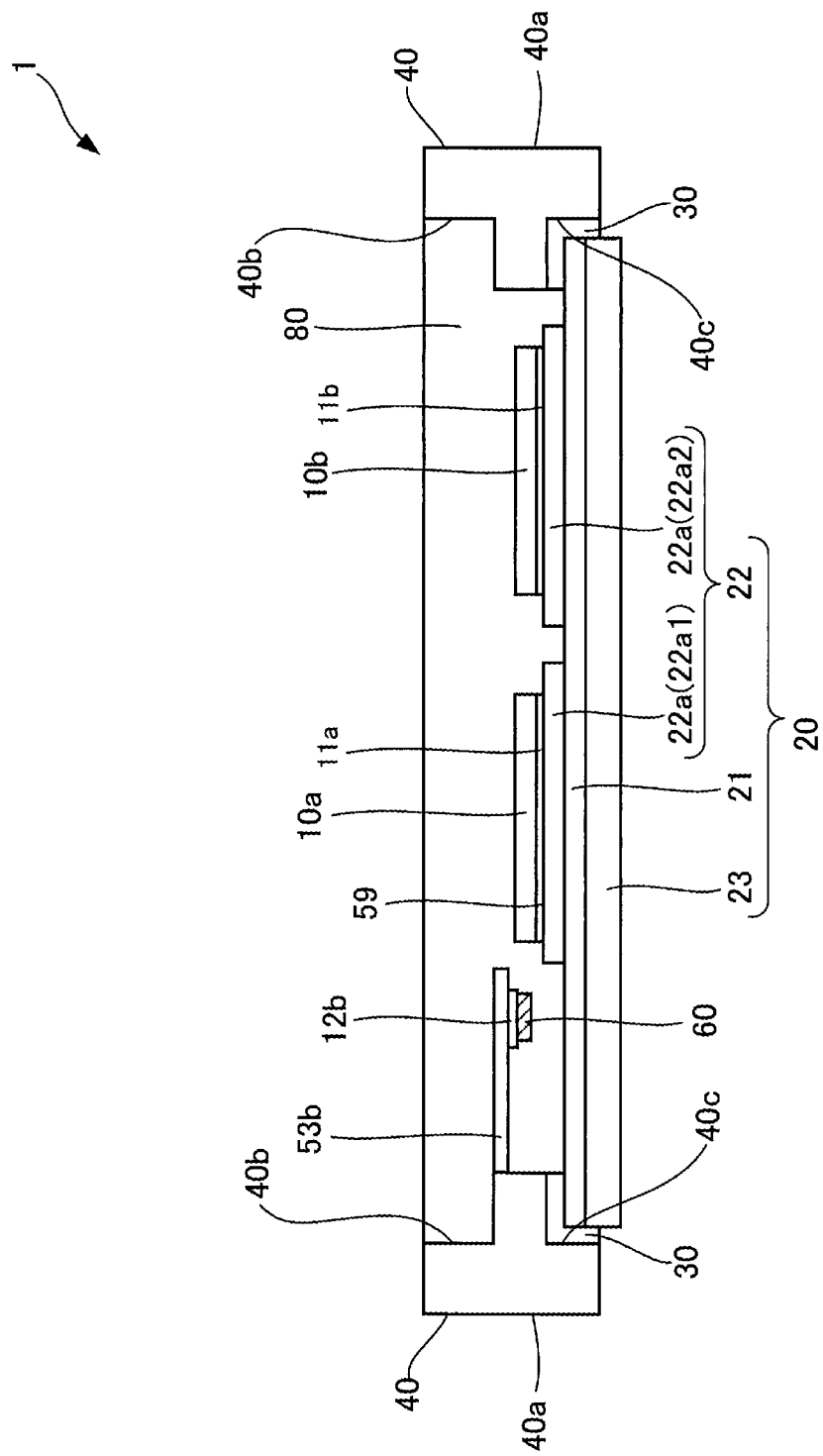
FIG. 3 is a cross-sectional view of the semiconductor device according to the first embodiment (part 2)
Figure 4:
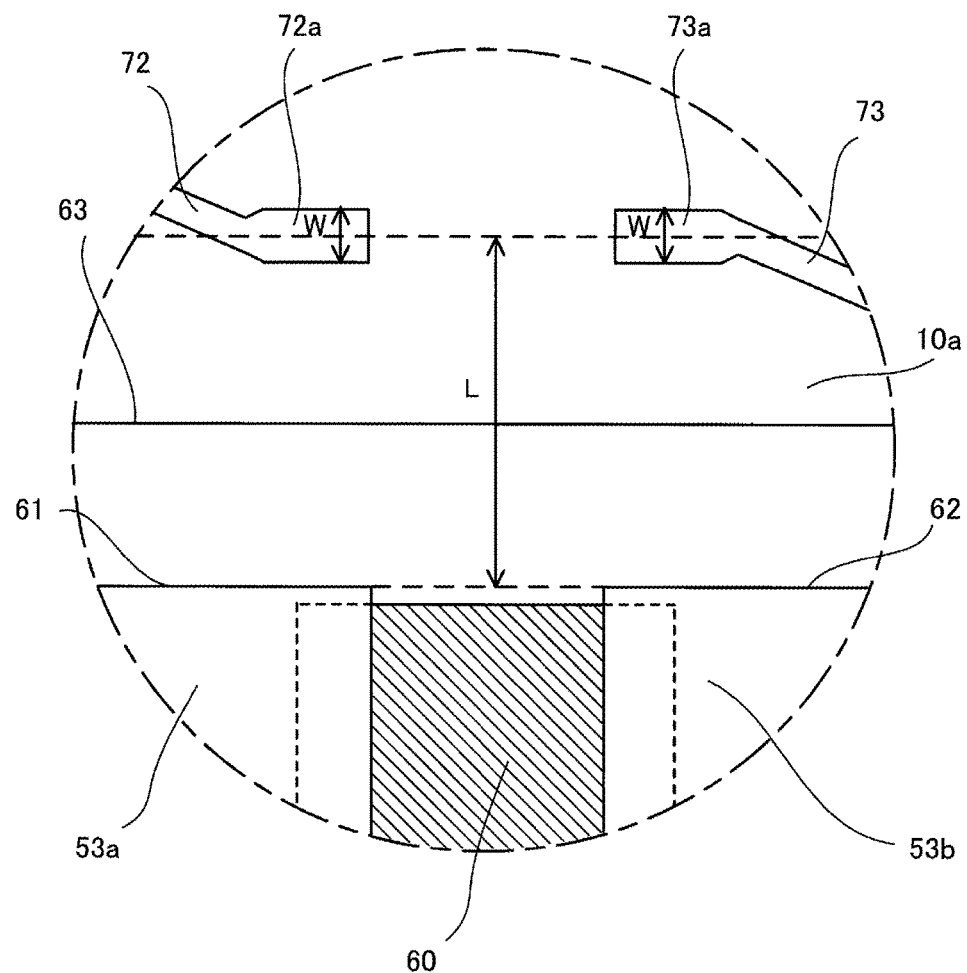
FIG. 4 is an enlarged view of the semiconductor device according to the first embodiment.

FIG. 1 is a top view of a semiconductor device according to a first embodiment. FIGS. 2 and 3 are cross-sectional views of the semiconductor device according to the first embodiment. FIG. 4 is an enlarged view of the semiconductor device according to the first embodiment.

FIG. 2 is a cross-sectional view taken on the dot-dash line X-X of FIG. 1. FIG. 3 is a cross-sectional view taken on the dot-dash line Y-Y of FIG. 1. FIG. 4 is an enlarged view of a portion indicated by the dot-dash line Z of FIG. 1. FIG. 3 does not illustrate wires.

A semiconductor device 1 includes semiconductor elements 10a and 10b, a laminated substrate 20, a temperature transducer 60, and a case 40. The laminated substrate 20 over which the semiconductor elements 10a and 10b are disposed is bonded to the case 40 and lead frames 51, 52, 53a, 53b, and 54 through 56 are integrally molded with the case 40. Furthermore, the semiconductor device 1 includes sealing resin 80 with which these components in the case 40 are sealed. The lead frames indicate external connection terminals.

Each of the semiconductor elements 10a and 10b is an insulated gate bipolar transistor (IGBT), a metal oxide semiconductor field effect transistor (MOSFET), a free wheeling diode (FWD), or the like.

The laminated substrate 20 includes an insulating board 21, a circuit board 22 which is formed over a front surface of the insulating board 21 and over which the semiconductor elements 10a and 10b are disposed, and a metal plate 23 formed over a back surface of the insulating board 21. The laminated substrate 20 having the above structure is 0.5 mm or more and 2.5 mm or less in thickness.

The insulating board 21 is formed by the use of a material having electric insulation. Aluminum oxide, silicon nitride, or the like is used as such a material.

The circuit board 22 is formed by the use of metal, such as copper, having good conductivity, and includes circuit patterns 22a, 22b, and 22c. As illustrated in FIG. 1, in the first embodiment the semiconductor element 10a is disposed over a disposition area 22a1 of the circuit pattern 22a with a conductive bonding material 11a therebetween. The semiconductor element 10b is disposed over a disposition area 22a2 of the circuit pattern 22a with a conductive bonding material 11b therebetween.

In the first embodiment the conductive bonding materials 11a and 11b are solder. Each of the conductive bonding materials 11a and 11b may be a conductive adhesive such as a silver paste.

The metal plate 23 is disposed over the entire back surface of the insulating board 21 and is formed by the use of aluminum, iron, silver, copper, an alloy containing these metals, or the like having high thermal conductivity. The metal plate 23 is 0.5 mm or more and 2 mm or less, for example, about 1.5 mm in thickness.

The case 40 has the shape of a frame in a top view. The lead frames 51, 52, 53a, and 53b and the lead frames 54, 55, and 56 are integrally molded with sides, respectively, of the case 40 opposite each other which form a pair.

The laminated substrate 20 may further include a radiation plate (not illustrated) which is bonded to a lower surface of the metal plate 23 and which is thicker than the metal plate 23. Furthermore, the laminated substrate 20 may include a radiation plate which is thicker than the metal plate 23 in place of the metal plate 23. The radiation plate may have a plate shape and include a radiation fin.

Furthermore, the case 40 has the shape of a frame and an opening is formed in a depth direction from a front surface (upper surface) illustrated in FIG. 1 to a back surface. A protruding convex portion 40a is formed halfway inside the opening. The front surface illustrated in FIG. 1 is parallel to the front surface of the insulating board 21.

The case 40 includes a frame portion 40b perpendicular to a side on the front surface side of the convex portion 40a parallel to the front surface (upper surface). Furthermore, the case 40 includes a frame portion 40c perpendicular to a side on the back surface side of the convex portion 40a. With the case 40 the laminated substrate 20 is bonded with an adhesive 30 to the side on the back surface side of the convex portion 40a and the frame portion 40c perpendicular to the side on the back surface side of the convex portion 40a.

The above case 40 is formed by the use of resin such as polyphenylene sulfide resin (PPS resin), polybutylene terephthalate resin (PBT resin), polyamide resin (PA resin), or acrylonitrile butadiene styrene resin (ABS resin).

If the case 40 and the laminated substrate 20 including a radiation plate are bonded together, the following method may be used in place of an adhesive. A through hole is made in the case 40 and the case 40 is screwed to the radiation plate of the laminated substrate 20 (not illustrated).

Furthermore, with the laminated substrate 20 over which the semiconductor elements 10a and 10b are disposed and which is bonded to the case 40, main electrodes on a front surface of each of the semiconductor elements 10a and 10b and the lead frames 51, 52, 53a, 53b, and 54 through 56 are properly connected electrically by wires 71 through 77. For example, the wire 71 electrically connects main electrodes on a front surface of the semiconductor element 10b and the lead frame 51. The wire electrically connects main electrodes on a front surface of the semiconductor element 10a and the lead frame 52. The wire 73 electrically connects a main electrode of the semiconductor element 10a and the circuit pattern 22b included in the circuit board 22 of the laminated substrate 20. The wire 74 electrically connects the circuit pattern 22b included in the circuit board 22 of the laminated substrate 20 and the lead frame 56. The wire 75 electrically connects the circuit pattern 22c included in the circuit board 22 of the laminated substrate 20 and the lead frame 55. The wire 76 electrically connects the circuit pattern 22a included in the circuit board 22 of the laminated substrate 20 and the lead frame 54. The wire 77 electrically connects a main electrode of the semiconductor element 10b and the circuit pattern 22c included in the circuit board 22 of the laminated substrate 20.

The lead frame 53a integrally molded with the case 40 has a straight plate shape. The lead frame 53b integrally molded in the same way with the case 40 is a plate having the shape of the letter "L." That is to say, two rectangles different in long-side length are perpendicular to each other. One end portion of the lead frame 53a is disposed outside the case 40 and the other end portion of the lead frame 53a is disposed over the laminated substrate 20 inside the case 40 and near the semiconductor element 10a. An end portion of the lead frame 53b on a side on which the lead frame 53b is straight is disposed outside the case 40 and an end portion of the lead frame 53b on a side on which the lead frame 53b has a right angle is disposed over the laminated substrate 20 inside the case 40 and near the semiconductor element 10a.

The lead frames 51, 52, 53a, 53b, and 54 through 56 are disposed so that a surface on the back surface side of each of them and the side on the front surface side of the convex portion 40a of the case 40 will be on the same plane. Furthermore, to fix the lead frames 51, 52, 53a, 53b, and 54 through 56 in the case 40, protrusions (not illustrated) may properly be formed by the use of the same resin that is used for forming the case 40 so as to extend from the side on the front surface side of the convex portion 40a of the case 40 over the front surfaces of adjacent lead frames.

The lead frames 51, 52, 53a, 53b, and 54 through 56 are formed by the use of, for example, metal, such as copper, having good conductivity and are 0.3 mm or more and 0.8 mm or less, for example, about 0.5 mm in thickness. Furthermore, the lead frames 53a and 53b are, for example, about 1 mm in width.

The resistance characteristic of the temperature transducer 60 is such that a resistance value changes according to temperature. The temperature transducer 60 is a thermistor or the like which detects the temperature of the inside (semiconductor elements 10a and 10b) of the case 40. The temperature transducer 60 has a rectangular parallelepiped shape, for example, about 1 mm in length, about 0.5 mm in width, and about 0.5 mm in thickness. As illustrated in FIG. 1, the temperature transducer 60 is disposed near a side portion of the semiconductor element 10a in a top view. Furthermore, as illustrated in FIG. 3, the temperature transducer 60 is disposed in a cross-sectional view so as to be approximately level with the semiconductor element 10a. The temperature transducer 60 is bonded to an end portion on a surface of the lead frame 53a opposite the circuit board 22 of the laminated substrate 20 and an end portion on a surface of the lead frame 53b opposite the circuit board 22 of the laminated substrate 20 adjacent to the end portion on the surface of the lead frame 53a opposite the circuit board 22 of the laminated substrate 20 with conductive bonding materials 12a and 12b, respectively, therebetween. Accordingly, the temperature transducer 60 is bonded, not to the front surfaces of the lead frames 53a and 53b illustrated in FIG. 1, but to the back surfaces of the lead frames 53a and 53b with the conductive bonding materials 12a and 12b, respectively, therebetween.

In the first embodiment the conductive bonding materials 12a and 12b are silver pastes. Conductive adhesives other than solder or a silver paste may be used as the conductive bonding materials 12a and 12b.

As illustrated in FIG. 4, the lead frames 53a and 53b are distant from wire bonding positions on main electrodes of the semiconductor element 10a to a degree that interference between a bonding tool (not illustrated) for bonding the wires 72, 73, and so on, and an end portion 61 in a longitudinal direction of the lead frame 53a opposite a side portion 63 of the semiconductor element 10a or an end portion 62 of the lead frame 53b opposite the side portion 63 of the semiconductor element 10a is prevented. For example, there is need to set a distance L between the end portion 61 in the longitudinal direction of the lead frame 53a and the end portion 62 of the lead frame 53b and wire bonding positions of the wires 72 and 73, respectively, on the semiconductor element 10a to at least 3 mm. The wire bonding positions are the central positions in the width direction W of wire bonding portions 72a and 73a where the wires 72 and 73 are bonded to main electrodes of the semiconductor element 10a. The distance L is needed for all portions where wire bonding is performed.

In the first embodiment the lead frames 53a and 53b and the temperature transducer 60 are connected without using wires. As described later, this obviates the need to leave a space between the frame portion 40b perpendicular to the side on the front surface side of the convex portion 40a of the case 40 and the lead frame 53a, between the frame portion 40b and the lead frame 53b, between the lead frame 53a and the side portion 63 of the semiconductor element 10a, or between the lead frame 53b and the side portion 63 of the semiconductor element 10a for preventing interference by a wire bonding tool. As a result, the semiconductor device 1 is miniaturized.

Furthermore, the circuit board 22 over which the semiconductor element 10a is disposed is formed over the insulating board 21. Disposition is performed so that the front surface of the insulating board 21 will be opposed to the surfaces of the lead frames 53a and 53b over which the temperature transducer 60 is mounted. This obviates the need to leave a space for preventing interference by a wire bonding tool. Accordingly, the distance between the semiconductor element 10a and the temperature transducer 60 is reduced. As a result, the accuracy with which the temperature transducer 60 detects temperature is improved.

A process for fabricating the above semiconductor device 1 will now be described by the use of FIGS. 1 through 4 and FIGS. 5 through 7.

Figure 5:
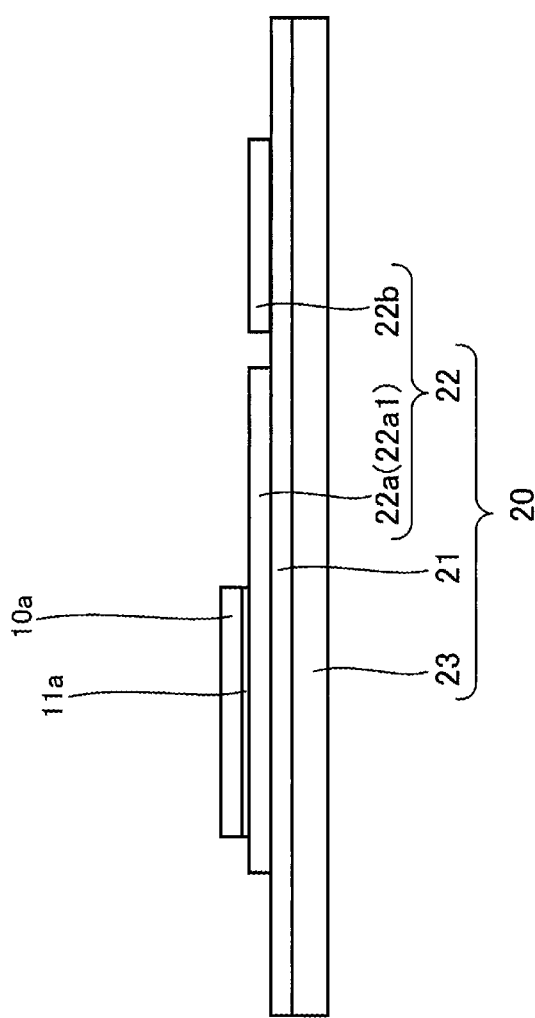
FIG. 5 illustrates a process for fabricating the semiconductor device according to the first embodiment (part 1)
Figure 6:
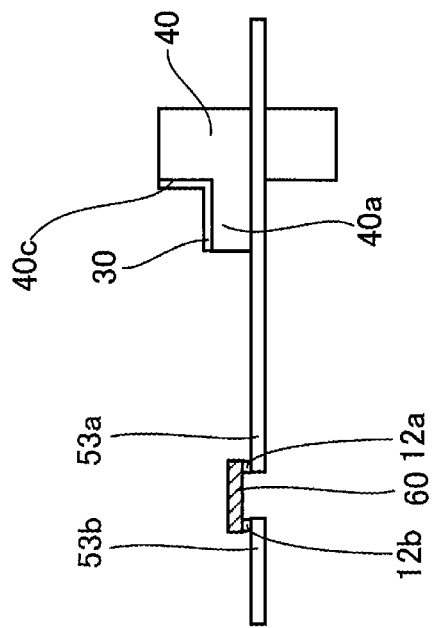
FIG. 6 illustrates a process for fabricating the semiconductor device according to the first embodiment (part 2)
Figure 6:
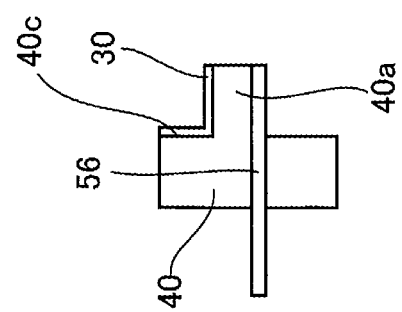
Figure 7:
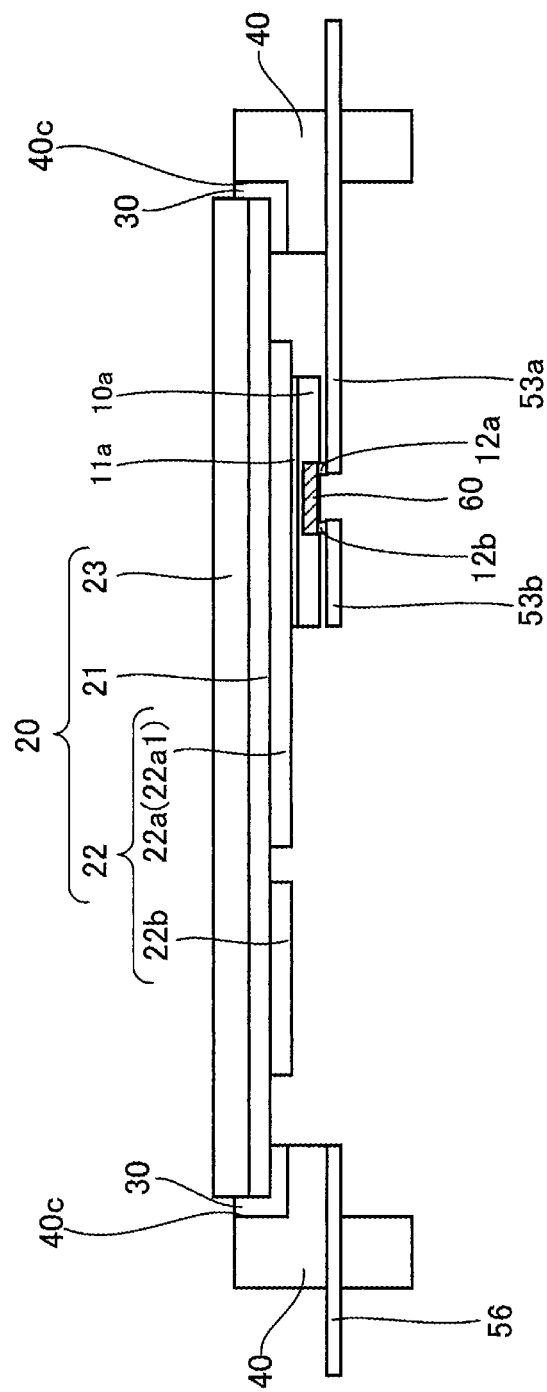
FIG. 7 illustrates a process for fabricating the semiconductor device according to the first embodiment (part 3)

FIGS. 5 through 7 illustrate a process for fabricating the semiconductor device according to the first embodiment.

FIGS. 5 through 7 are cross-sectional views taken on the dot-dash line X-X of FIG. 1.

First the laminated substrate 20 including the insulating board 21, the circuit board 22 formed over the front surface of the insulating board 21, and the metal plate 23 formed over the back surface of the insulating board 21 is prepared.

As illustrated in FIG. 5, the semiconductor element 10a is disposed over the disposition area 22a1 of the circuit pattern 22a included in the circuit board 22 of the above laminated substrate 20 with the conductive bonding material 11a therebetween. Furthermore, the semiconductor element 10b is disposed over the disposition area 22a2 of the circuit pattern 22a included in the circuit board 22 with the conductive bonding material 11b therebetween (not illustrated in FIG. 5).

As illustrated in FIG. 6, the case 40 integrally molded with the lead frames 51, 52, 53a, 53b, and 54 through 56 (FIG. 6 illustrates the lead frames 53a, 53b, and 56) is then prepared. The case 40 is prepared with the front surface down and the back surface up.

Furthermore, the temperature transducer 60 is bonded to the end portion on the back surface of the lead frame 53a and the end portion on the back surface of the lead frame 53b adjacent to the end portion on the back surface of the lead frame 53a with the conductive bonding materials 12a and 12b, respectively, therebetween.

In addition, the adhesive 30 is applied to the side on the back surface side of the convex portion 40a of the case 40 and the frame portion 40c (upper side in FIG. 6) perpendicular to the side on the back surface side of the convex portion 40a.

The laminated substrate 20 is then fixed to the side on the back surface side of the convex portion 40a of the case 40 and the frame portion 40c (upper side in FIG. 7) perpendicular to the side on the back surface side of the convex portion 40a with the adhesive 30 therebetween. As illustrated in FIG. 7, at this time the temperature transducer 60 is disposed near the side portion of the semiconductor element 10a.

Furthermore, the conductive bonding materials 12a and 12b with which the temperature transducer 60 and the lead frames 53a and 53b are bonded together and the adhesive 30 with which the case 40 and the laminated substrate 20 are bonded together solidify.

The case 40 to which the laminated substrate 20 is fixed is then placed with the back surface down and the front surface up and electrical connections are properly made between the main electrodes of the semiconductor elements 10a and 10b, the front surfaces of the lead frames 51, 52, and 54 through 56, and the circuit board 22 by the use of the wires 71 through 77.

The circuit board 22 of the laminated substrate 20, the semiconductor elements 10a and 10b, the lead frames 51, 52, 53a, 53b, and 54 through 56, and the temperature transducer 60 in the case 40 are sealed with the sealing resin 80.

By performing the above process, the semiconductor device 1 illustrated in FIGS. 1 through 4 is fabricated.

With respect to the semiconductor device 1, a semiconductor device as an example for reference will be described by the use of FIG. 8.

Figure 8:
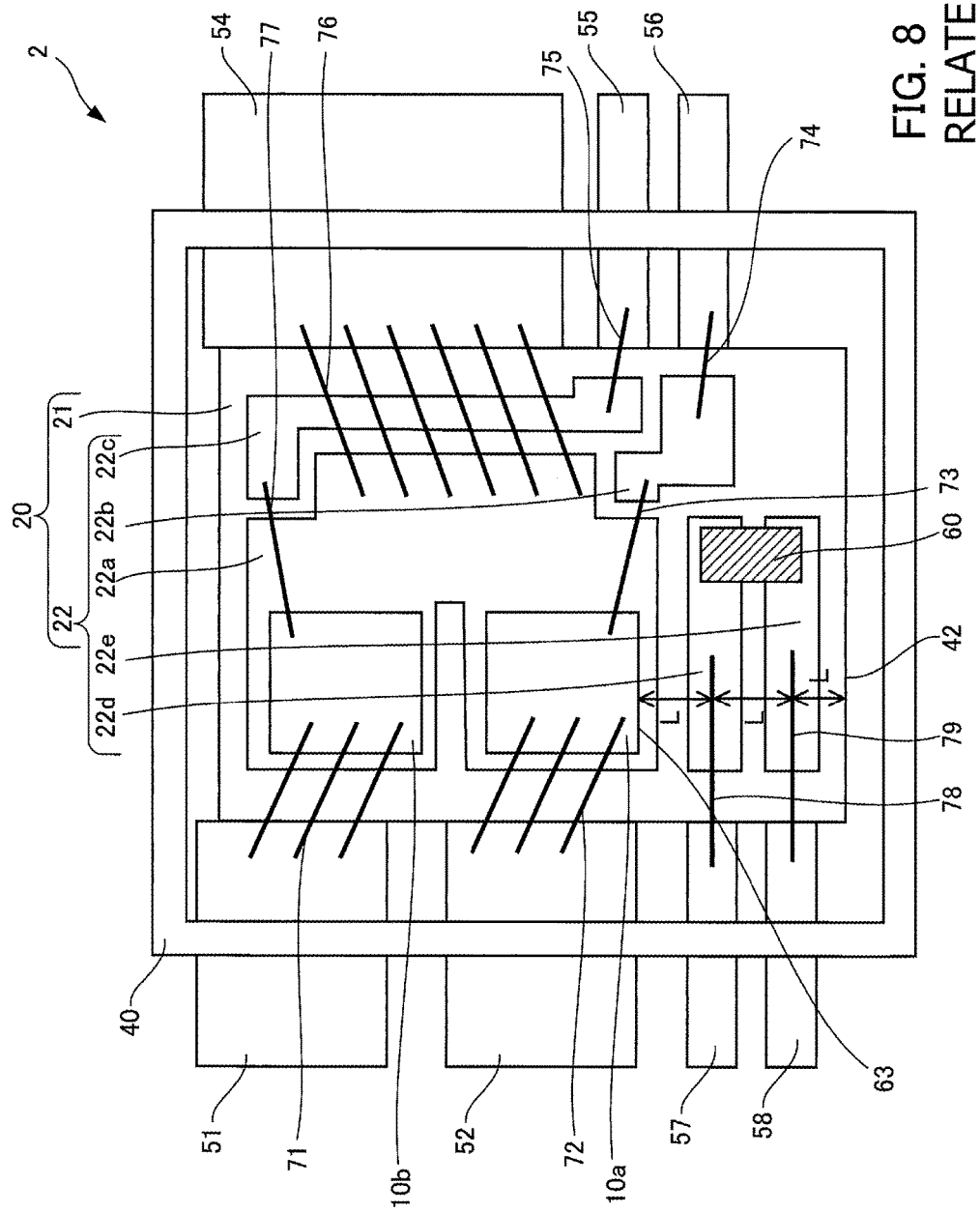
FIG. 8 is a top view of a semiconductor device as an example for reference.

FIG. 8 is a top view of a semiconductor device as an example for reference.

Components of a semiconductor device 2 in FIG. 8 which are the same as those of the semiconductor device 1 are marked with the same numerals.

The semiconductor device 2 includes semiconductor elements 10a and 10b, a laminated substrate 20, a temperature transducer 60, and a case 40. The laminated substrate 20 over which the semiconductor elements 10a and 10b are disposed is bonded to the case 40 and lead frames 51, 52, and 54 through 58 are integrally molded with the case 40. Furthermore, the semiconductor device 2 includes sealing resin 80 (not illustrated) with which these components in the case 40 are sealed.

With the semiconductor device 2 a circuit board formed over an insulating board 21 of the laminated substrate 20 includes circuit patterns 22d and 22e in addition to circuit patterns 22a through 22c. Furthermore, with the semiconductor device 2 a temperature transducer is disposed between the circuit patterns 22d and 22e (over right end portions of the circuit patterns 22d and 22e in FIG. 8).

The lead frames 51, 52, and 54 through 56 are integrally molded with the case 40. This is the same with the semiconductor device 1. In addition, as illustrated in FIG. 8, the lead frames 57 and 58 are integrally molded with the case 40. Furthermore, the case 40 has the shape of a frame in a top view.

Furthermore, a wire 78 electrically connects the lead frame 57 and the circuit pattern 22d included in the circuit board 22 of the laminated substrate 20. A wire 79 electrically connects the lead frame 58 and the circuit pattern 22e included in the circuit board 22 of the laminated substrate 20.

In order to properly detect the temperature of the semiconductor element 10a in the semiconductor device 2 having the above structure, it is desirable to dispose the temperature transducer 60 over the circuit patterns 22d and 22e so as to be adjacent to the semiconductor element 10a. However, in order to connect the lead frames 57 and 58 and the circuit patterns 22d and 22e by the use of the wires 78 and 79 respectively, there is need to keep a distance L between a bottom portion 42 of a convex portion 40a of the case 40 (sidewall of an opening of the case 40) and a wire bonding position on the circuit pattern 22e, between the wire bonding position on the circuit pattern 22e and a wire bonding position on the circuit pattern 22d, and between the wire bonding position on the circuit pattern 22d and a side portion 63 of the semiconductor element 10a. The reason for this is to prevent interference by a wire bonding tool. This makes it impossible to dispose the temperature transducer 60 over the circuit patterns 22d and 22e so as to be adjacent to the semiconductor element 10a. There is need to dispose the temperature transducer 60 in a position over the circuit patterns 22d and 22e (over the right end portions of the circuit patterns 22d and 22e in FIG. 8) distant from the semiconductor element 10a. Accordingly, with the semiconductor device 2 the temperature of the semiconductor element 10a is not properly detected by the temperature transducer 60.

If the temperature transducer 60 is disposed over the circuit patterns 22d and 22e so as to be adjacent to the semiconductor element 10a, there is need to raise the loop height of the wires 78 and 79 at wire bonding time. This increases the thickness of the semiconductor device 2.

Furthermore, with the semiconductor device 2 there is need to keep the distance L between the bottom portion of the convex portion 40a of the case 40 (innermost portion of the opening of the case 40) and the wire bonding position on the circuit pattern 22e, between the wire bonding position on the circuit pattern 22e and the wire bonding position on the circuit pattern 22d, and between the wire bonding position on the circuit pattern 22d and the side portion 63 of the semiconductor element 10a. This impedes miniaturization. As described above, there is need to set the distance L to at least 3 mm.

On the other hand, the semiconductor device 1 includes the semiconductor element 10a, the laminated substrate 20 including the insulating board 21 and the circuit board 22 which is formed over the front surface of the insulating board 21 and over which the semiconductor element 10a is disposed, and the case 40 which is bonded to the laminated substrate 20 so that the semiconductor element 10a will be disposed inside the case 40. The semiconductor device 1 includes the lead frames 53a and 53b formed in the case 40. One end portion of each of the lead frames 53a and 53b is disposed outside the case 40. The other end portion of each of the lead frames 53a and 53b is disposed over the front surface of the insulating board 21 inside the case 40 and near the semiconductor element 10a. Furthermore, the semiconductor device 1 includes the temperature transducer 60 disposed over the other end portion of each of the lead frames 53a and 53b and near the side portion 63 of the semiconductor element 10a. Therefore, as stated above, with the semiconductor device 1 there is need to set the distance L only between the wire bonding position on the main electrode of the semiconductor element 10a and the end portion 61 in the longitudinal direction of the lead frame 53a opposite the side portion 63 of the semiconductor element 10a and between the wire bonding position on the main electrode of the semiconductor element 10a and the end portion 62 of the lead frame 53b opposite the side portion 63 of the semiconductor element 10a. In addition, the wire bonding positions on the main electrodes of the semiconductor element 10a are inside the side portion 63 of the semiconductor element 10a. Accordingly, the distance between the side portion 63 of the semiconductor element 10a and a side of the temperature transducer 60 opposite the side portion 63 of the semiconductor element 10a may be reduced.

As a result, with the semiconductor device 1 the side of the temperature transducer 60 opposite the semiconductor element 10a is disposed near the side portion 63 of the semiconductor element 10a. Therefore, the temperature of the semiconductor element 10a is properly detected.

With the semiconductor device 1 illustrated in FIG. 1, the distance from the side portion 63 of the semiconductor element 10a to the side of the temperature transducer 60 opposite the side portion 63 of the semiconductor element 10a may be reduced to about 1.25 mm. In this case, the following simulation is performed. It is assumed that the semiconductor element 10a generates heat at an ambient temperature of 25° C. and that the temperature of the semiconductor element 10a rises to 56.2° C. As a result of the simulation, the temperature of the surface of the temperature transducer 60 is 30° C. With the semiconductor device 2, on the other hand, the distance from the side portion 63 of the semiconductor element 10a to a side of the temperature transducer 60 opposite the side portion 63 of the semiconductor element 10a is about 2.25 mm. The temperature of the surface of the temperature transducer 60 is 26.4° C. That is to say, heat generation by the semiconductor element 10a in the semiconductor device 1 is detected more properly and rapidly than heat generation by the semiconductor element 10a in the semiconductor device 2.

Furthermore, with the semiconductor device 1 the temperature transducer 60 is disposed over the other end portion of each of the lead frames 53a and 53b and near the side portion 63 of the semiconductor element 10a. Accordingly, if the length in the vertical direction of the semiconductor device 2 in FIG. 8 is, for example, 55 mm, then the length in the vertical direction of the semiconductor device 1 in FIG. 1 is 52 mm. That is to say, the semiconductor device 1 is about 3 mm shorter than the semiconductor device 2. This makes it possible to miniaturize the semiconductor device 1 by about 5 percent without increasing its thickness. Furthermore, miniaturization of the semiconductor device 1 reduces manufacturing costs.

Second Embodiment

In the second embodiment a semiconductor device obtained by miniaturizing the semiconductor device 1 according to the first embodiment further will be described by the use of FIGS. 9 and 10.

Figure 9:
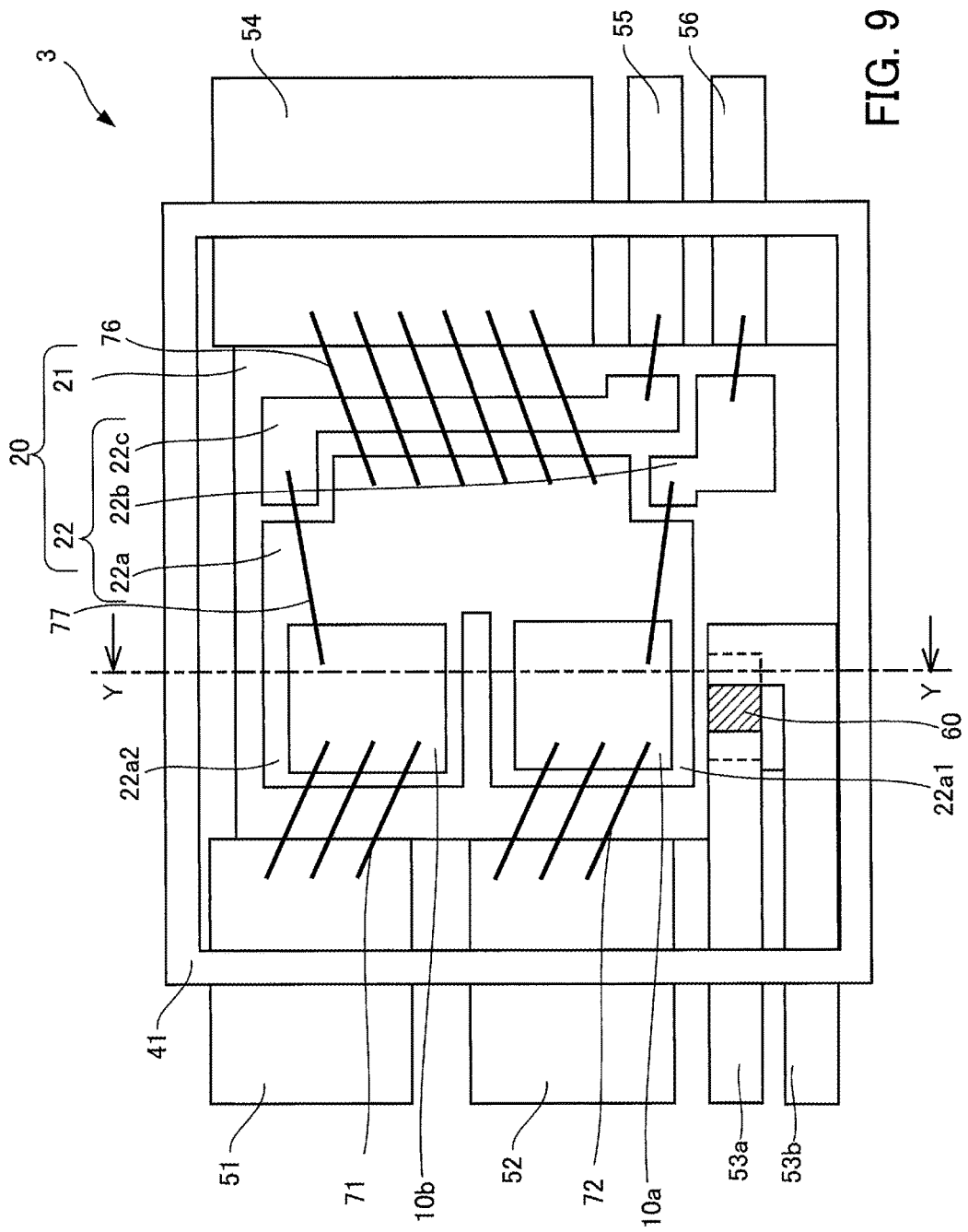
FIG. 9 is a top view of a semiconductor device according to a second embodiment.

FIG. 9 is a top view of a semiconductor device according to a second embodiment. FIG. 10 is a cross-sectional view of the semiconductor device according to the second embodiment.

Figure 10:
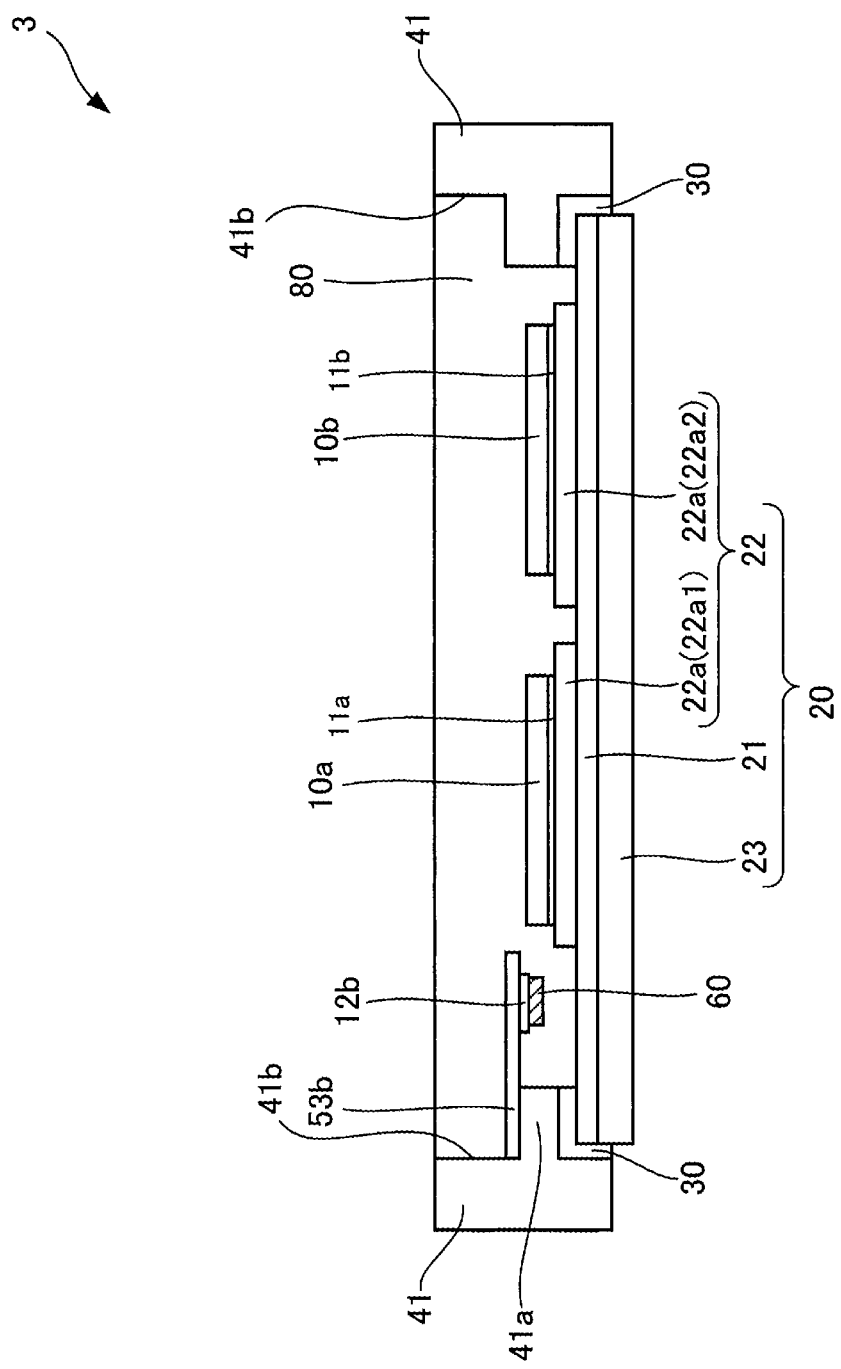
FIG. 10 is a cross-sectional view of the semiconductor device according to the second embodiment.

FIG. 10 is a cross-sectional view taken on the dot-dash line Y-Y of FIG. 9.

Furthermore, components in FIGS. 9 and 10 which are the same as those of the semiconductor device 1 are marked with the same numerals.

A semiconductor device 3 includes semiconductor elements 10a and 10b, a laminated substrate 20, a temperature transducer 60, and a case 41. The laminated substrate 20 over which the semiconductor elements 10a and 10b are disposed is bonded to the case 41 and lead frames 51, 52, 53a, 53b, and 54 through 56 are integrally molded with the case 41. Furthermore, the semiconductor device 3 includes sealing resin 80 with which these components in the case 41 are sealed.

The semiconductor device 3 has the same structure as the semiconductor device 1 has. However, the lead frame 53b is disposed so that a back surface of the lead frame 53b and a side on a front surface side of a convex portion 41a of the case 41 will be on the same plane (FIG. 10). Furthermore, an end portion on the case 41 side of the lead frame 53b parallel to the longitudinal direction of the lead frame 53a is placed in proximity to a frame portion 41b perpendicular to the side on the front surface side of the convex portion 41a of the case 41. As a result, the length in the vertical direction of the case 41 of the semiconductor device 3 in FIG. 9 is made shorter than the length in the vertical direction of the case 40 of the semiconductor device 1.

Accordingly, the semiconductor device 3 is miniaturized more than the semiconductor device 1. In addition, miniaturization of the semiconductor device 3 reduces manufacturing costs.

Third Embodiment

In a third embodiment a semiconductor device which differs from the semiconductor device 1 according to the first embodiment in the position of a temperature transducer will be described by the use of FIGS. 11 and 12.

Figure 11:
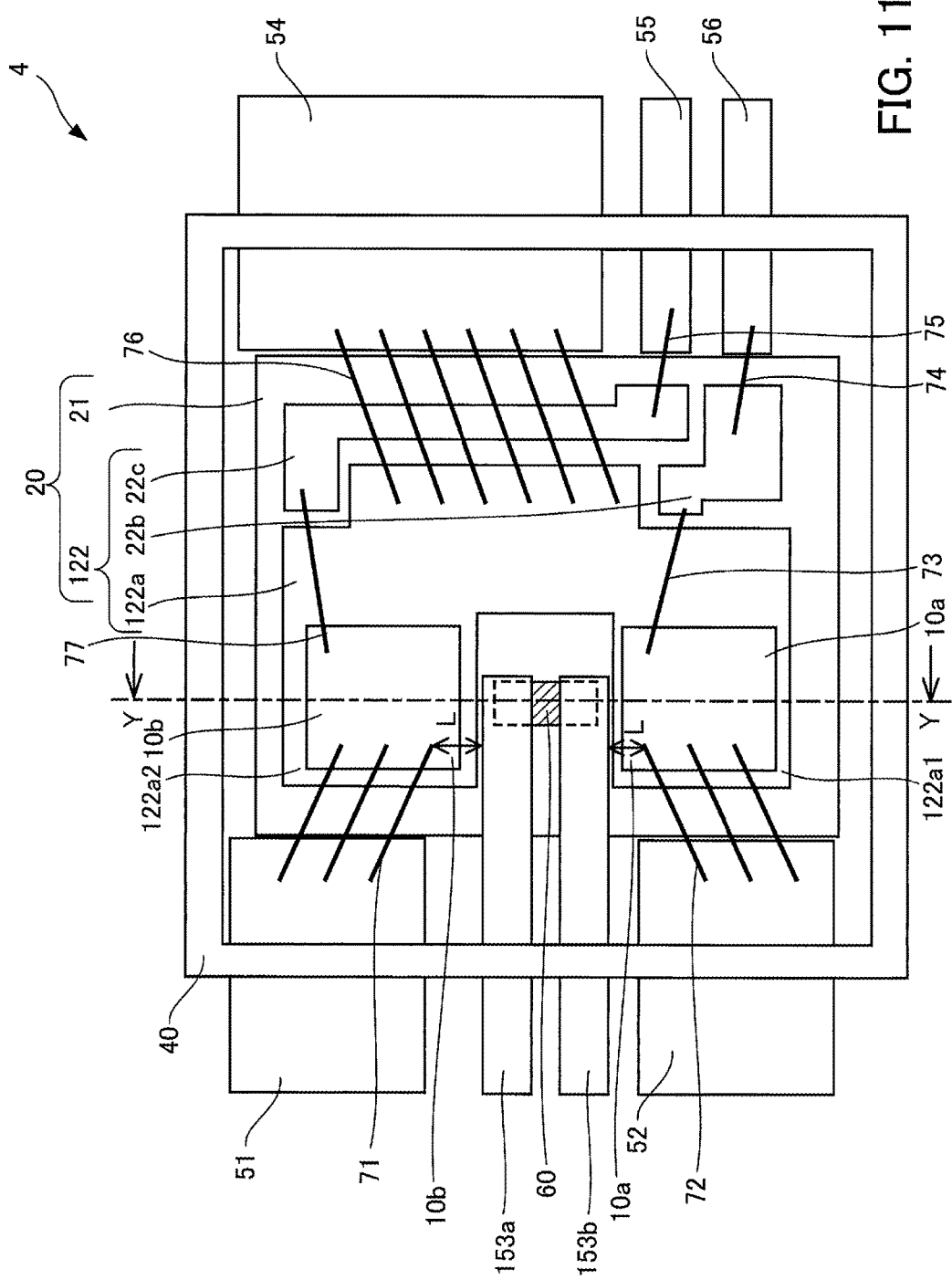
FIG. 11 is a top view of a semiconductor device according to a third embodiment.

FIG. 11 is a top view of a semiconductor device according to a third embodiment. FIG. 12 is a cross-sectional view of the semiconductor device according to the third embodiment.

Figure 12:
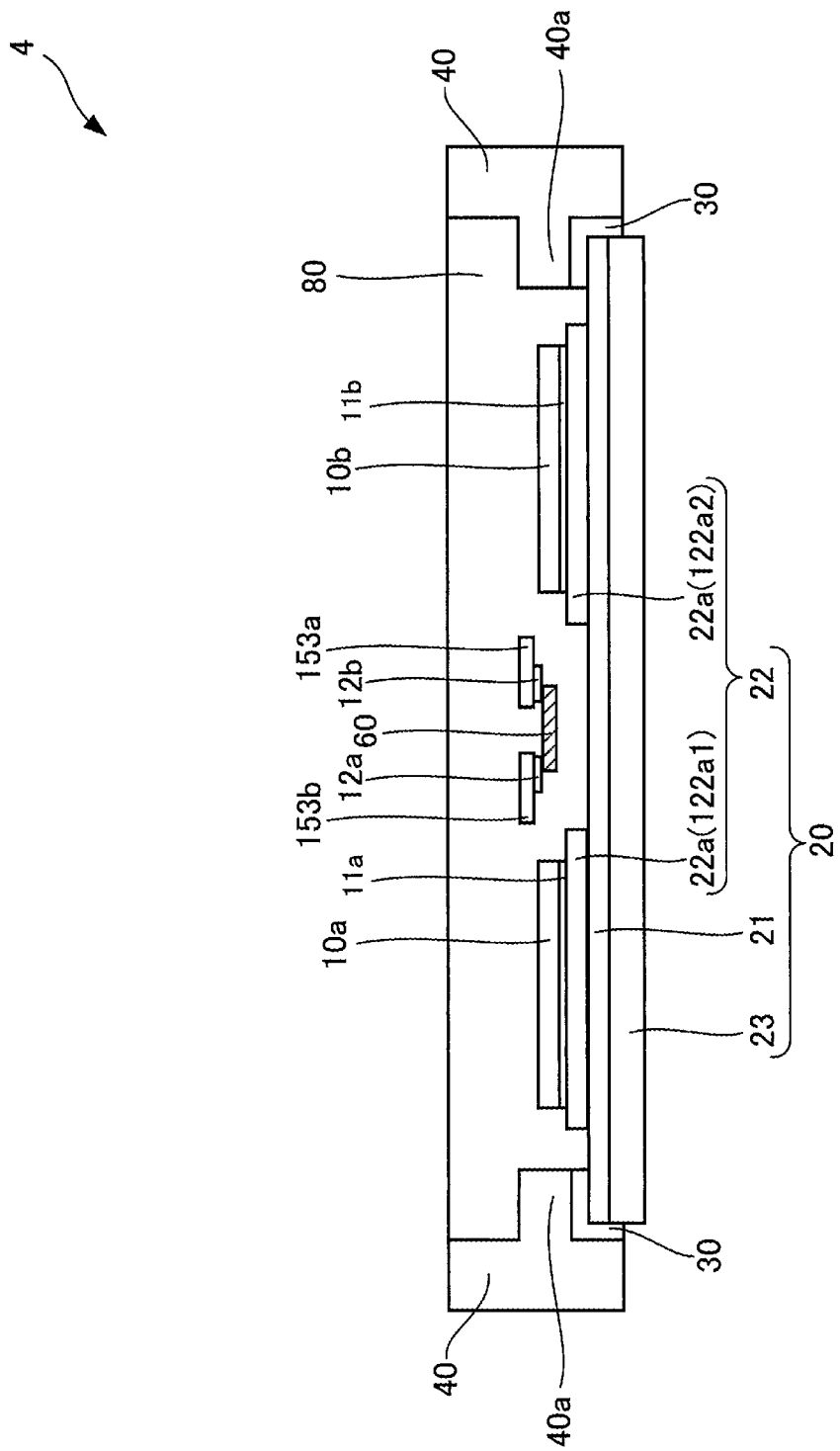
FIG. 12 is a cross-sectional view of the semiconductor device according to the third embodiment.

FIG. 12 is a cross-sectional view taken on the dot-dash line Y-Y of FIG. 11.

Furthermore, components in FIGS. 11 and 12 which are the same as those of the semiconductor device 1 are marked with the same numerals.

A semiconductor device 4 includes semiconductor elements 10a and 10b, a laminated substrate 20, a temperature transducer 60, and a case 40. The laminated substrate 20 over which the semiconductor elements 10a and 10b are disposed is bonded to the case 40 and lead frames 51, 52, 153a, 153b, and 54 through 56 are integrally molded with the case 40. Furthermore, the semiconductor device 4 includes sealing resin 80 with which these components in the case 40 are sealed.

The laminated substrate 20 includes an insulating board 21, a circuit board 122 which is formed over a front surface of the insulating board 21 and over whose disposition areas 122a1 and 122a2 the semiconductor elements 10a and 10b, respectively, are disposed, and a metal plate 23 formed over a back surface of the insulating board 21.

The circuit board 122 is formed by the use of, for example, metal, such as copper, having good conductivity, and includes circuit patterns 122a, 22b, and 22c. The circuit pattern 122a differs from the circuit pattern 22a in the first embodiment in shape. The circuit pattern 122a has the following shape. A space between the disposition areas 122a1 and 122a2 over which the semiconductor elements 10a and 10b, respectively, are disposed is wider than the space between the disposition areas 22a1 and 22a2 of the circuit pattern 22a of the semiconductor device 1. The semiconductor element 10a is disposed over the disposition area 122a1 of the circuit pattern 122a with a conductive bonding material 11a therebetween. The semiconductor element 10b is disposed over the disposition area 122a2 of the circuit pattern 122a with a conductive bonding material 11b therebetween. The conductive bonding materials 11a and 11b are solder. Each of the conductive bonding materials 11a and 11b may be a conductive adhesive such as a silver paste.

The case 40 has the shape of a frame in a top view. This is the same with the first embodiment. The length in the vertical direction of the case 40 in FIG. 11 is about 55 mm and the length in the horizontal direction of the case 40 in FIG. 11 is about 35 mm. The lead frames 51, 153a, 153b, and 52 and the lead frames 54, 55, and 56 are integrally molded with sides, respectively, of the case 40 opposite each other which form a pair.

The lead frames 51, 52, 153a, 153b, and 54 through 56 are formed by the use of, for example, metal, such as copper, having good conductivity and are 0.3 mm or more and 0.8 mm or less, for example, about 0.5 mm in thickness. Furthermore, the lead frames 153a and 153b are, for example, about 1 mm in width. These are the same with the first embodiment.

Each of the lead frames 153a and 153b has a straight plate shape. Furthermore, an opening is formed in the case 40 in a depth direction from a front surface (upper surface) illustrated in FIG. 11 to a back surface. A convex portion 40a is formed halfway inside the opening. The case 40 includes a frame portion 40b perpendicular to a side on the front surface side of the convex portion 40a parallel to the front surface (upper surface). Furthermore, the case 40 includes a frame portion 40c perpendicular to a side on the back surface side of the convex portion 40a. With the case 40 the laminated substrate 20 is bonded with an adhesive 30 to the side on the back surface side of the convex portion 40a and the frame portion 40c perpendicular to the side on the back surface side of the convex portion 40a. In this case, in order to prevent interference by a wire bonding tool, there is need to set a distance L between an end portion in the longitudinal direction on the semiconductor element 10b side of the lead frame 153a and a wire bonding position of a wire 71 and between an end portion in the longitudinal direction on the semiconductor element 10a side of the lead frame 153b and a wire bonding position of a wire 72 to at least 3 mm. This is the same with the first embodiment.

When the laminated substrate 20 is fixed to the case 40, the end portions (inside the case 40) of the lead frames 153a and 153b are disposed over the laminated substrate 20 in the case 40 and between the semiconductor elements 10a and 10b in a top view.

The temperature transducer 60 is disposed on a side of the end portions of the lead frames 153a and 153b opposite the front surface of the insulating board 21 of the laminated substrate 20 and is situated between the semiconductor elements 10a and 10b (FIG. 12).

In addition, electrical connections are properly made between the semiconductor elements 10a and 10b, the lead frames 51, 52, and 54 through 56, and the circuit board 122 by the use of the wires 71 and 72 and wires 73 through 77.

The above semiconductor device 4 includes the semiconductor elements 10a and 10b, the laminated substrate 20 including the insulating board 21 and the circuit board 122 which is formed over the front surface of the insulating board 21 and over which the semiconductor elements 10a and 10b are disposed, and the case 40 to which the laminated substrate 20 is bonded. This is the same with the semiconductor device 1. The semiconductor device 4 includes the lead frames 153a and 153b formed in the case 40. One end portion of each of the lead frames 153a and 153b is disposed outside the case 40 and the other end portion of each of the lead frames 153a and 153b is disposed over the laminated substrate 20 inside the case 40 and near the semiconductor elements 10a and 10b. Furthermore, the semiconductor device 4 includes the temperature transducer 60 disposed on a side of the other end portion of each of the lead frames 153a and 153b opposite the laminated substrate 20 and disposed between the semiconductor elements 10a and 10b near side portions of the semiconductor elements 10a and 10b.

As a result, with the semiconductor device 4 the temperature transducer 60 is also disposed near the side portions of the semiconductor elements 10a and 10b. Therefore, the temperature of the semiconductor elements 10a and 10b is properly detected.

In addition, the length in the vertical direction of the semiconductor device 4 in FIG. 11 is made shorter than the length in the vertical direction of the semiconductor device 2 in FIG. 8. This is the same with the semiconductor device 1. Accordingly, the semiconductor device 4 is miniaturized. This reduces manufacturing costs.

According to the disclosed technique, a semiconductor device is miniaturized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a semiconductor element;
a laminated substrate including:
  an insulating board, and
  a circuit board which is formed over a front surface of the insulating board and over which the semiconductor element is disposed;
a case bonded to the laminated substrate so that the semiconductor element is disposed inside;
an external connection terminal including one end portion disposed outside the case and another end portion disposed over the front surface of the insulating board inside the case, the external connection terminal being formed in the case; and
a temperature transducer which is disposed over the other end portion of the external connection terminal and which includes a side opposite a side portion of the semiconductor element in a top view.

2. The semiconductor device according to claim 1, wherein:
the external connection terminal is a plate-shaped lead frame;
the temperature transducer is disposed over one surface of the other end portion of the external connection terminal; and
the front surface of the insulating board and the one surface of the other end portion of the external connection terminal are opposite each other.

3. The semiconductor device according to claim 2, wherein the temperature transducer has a rectangular parallelepiped shape.

4. The semiconductor device according to claim 1, further comprising a wire electrically connected to a main electrode of the semiconductor element, wherein an end portion of the external connection terminal is disposed so as to be a predetermined distance from a center of a connection portion of the wire.

5. The semiconductor device according to claim 1, wherein:
the case has the shape of a frame and has an opening portion;
the case has a convex portion protruding to an inside of the opening portion;
the convex portion has sides inside the opening portion parallel to the front surface of the insulating board and a bottom portion perpendicular to the front surface of the insulating board; and
another surface of the other end portion of the external connection terminal and one of the sides are disposed on a same plane.

6. The semiconductor device according to claim 1, wherein the laminated substrate is bonded to another of the sides of the convex portion of the case.

7. A semiconductor device comprising:
a first semiconductor element and a second semiconductor element;
a laminated substrate including:
  an insulating board, and
  a circuit board which is formed over a front surface of the insulating board and over which the first semiconductor element and the second semiconductor element are disposed;
a case bonded to the laminated substrate so that the first semiconductor element and the second semiconductor element are disposed inside the case;
an external connection terminal including one end portion disposed outside the case and another end portion disposed over the front surface of the insulating board inside the case and between the first semiconductor element and the second semiconductor element, the external connection terminal being formed in the case; and
a temperature transducer disposed over one surface of the other end portion of the external connection terminal and situated between the first semiconductor element and the second semiconductor element,
wherein the front surface of the insulating board and the one surface of the other end portion of the external connection terminal are opposite each other.

8. The semiconductor device according to claim 7, wherein:
the external connection terminal is a plate-shaped lead frame; and the temperature transducer has a rectangular parallelepiped shape.

\* \* \* \* \*